US009795051B2

(12) United States Patent
Huang

(10) Patent No.: US 9,795,051 B2
(45) Date of Patent: Oct. 17, 2017

(54) HANDLE ASSEMBLY AND SERVER HAVING THE SAME

(71) Applicants: INVENTEC (PUDONG) TECHNOLOGY CORPORATION, Shanghai (CN); INVENTEC CORPORATION, Taipei (TW)

(72) Inventor: Ya-Ting Huang, Taipei (TW)

(73) Assignees: INVENTEC CORPORATION, Taipei (TW); INVENTEC (PUDONG) TECHNOLOGY CORPORATION, Shanghai (CN)

(*) Notice: Subject to any disclaimer, the term of this patent is extended or adjusted under 35 U.S.C. 154(b) by 0 days.

(21) Appl. No.: 15/086,183

(22) Filed: Mar. 31, 2016

(65) Prior Publication Data

US 2017/0150634 A1     May 25, 2017

(30) Foreign Application Priority Data

Nov. 20, 2015    (CN) .......................... 2015 1 0808729

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |
| *H05K 5/02* | (2006.01) |

(52) U.S. Cl.
CPC .......... *H05K 7/1487* (2013.01); *H05K 5/023* (2013.01); *H05K 5/0204* (2013.01); *H05K 5/0221* (2013.01)

(58) Field of Classification Search
CPC .... H05K 5/023; H05K 5/0217; H05K 5/0226; H05K 5/0204; H05K 7/1487; H05K 7/1489; G06F 1/181; G06F 1/183; G06F 1/187; G06F 1/188
USPC ............ 361/679.01, 679.02, 679.57, 679.58, 361/679.59
See application file for complete search history.

(56) References Cited

U.S. PATENT DOCUMENTS

| | | | | |
|---|---|---|---|---|
| 6,795,650 | B2 * | 9/2004 | Cahall .................... | G03B 13/06 348/333.01 |
| 6,804,111 | B1 * | 10/2004 | Williams ............. | G11B 33/125 312/223.1 |
| 6,952,341 | B2 * | 10/2005 | Hidaka ................ | G11B 33/128 312/332.1 |
| 7,639,490 | B2 * | 12/2009 | Qin ......................... | G06F 1/187 361/679.34 |
| 7,719,828 | B2 * | 5/2010 | Brown ................... | G11B 33/08 361/679.31 |

(Continued)

*Primary Examiner* — Anthony Haughton
(74) *Attorney, Agent, or Firm* — Mark M. Friedman

(57) ABSTRACT

A handle assembly includes a base seat, a handle, and a button. The handle is pivotally connected with the base seat, and includes a retaining section. There is a fastening slot formed in the retaining section. The button includes a latch which is outwardly extended. When the button is moved to a first position, the latch engages into the fastening slot to restrict a movement of the retaining section, thereby preventing a pivoting movement of the handle relative to the base seat; and when the button is moved to a second position, the latch is separated away from the fastening slot to push the handle, so that the handle is pivoted along a direction away from the base seat, thereby to facilitate a user to grip the handle to pull a hard disk driver from a server.

11 Claims, 5 Drawing Sheets

(56) References Cited

U.S. PATENT DOCUMENTS

| | | | | |
|---|---|---|---|---|
| 8,189,327 B2* | 5/2012 | Chang | ............... | G06F 1/187 |
| | | | | 361/679.01 |
| 8,411,429 B2* | 4/2013 | Li | ............... | G11B 33/124 |
| | | | | 361/679.33 |
| 8,456,832 B1* | 6/2013 | Brigham, Jr. | ............... | G06F 1/187 |
| | | | | 361/679.33 |
| 8,913,392 B1* | 12/2014 | Feroli | ............... | G11B 33/124 |
| | | | | 312/223.1 |
| 9,042,094 B2* | 5/2015 | Williams | ............... | G06F 1/16 |
| | | | | 361/679.37 |
| 2003/0201902 A1* | 10/2003 | Post | ............... | G06F 13/409 |
| | | | | 340/693.5 |
| 2011/0080705 A1* | 4/2011 | Figuerado | ............... | G06F 1/187 |
| | | | | 361/679.33 |
| 2012/0113583 A1* | 5/2012 | Peng | ............... | G06F 1/187 |
| | | | | 361/679.39 |

* cited by examiner

HANDLE ASSEMBLY AND SERVER HAVING THE SAME

FIELD OF THE INVENTION

The present invention relates to a handle assembly, and more particularly to a handle assembly which is suitable to be used in a server.

BACKGROUND OF THE INVENTION

With the development of technology, requests from users, such as a request for computational capability and data storage capability of a server system, will be increased. In general, the computational capability and data storage capability of the server system can be efficiently improved by mounting a variety of electronic devices such as hard disk drivers on the server system. In a conventional server, the electronic devices are firstly mounted on a carrier, and then the carrier is inserted in a corresponding installation slot of a rack of the server. In order to improve convenience for assembly and disassembly, the carrier is fitted onto the rack of the server in a drawer-type design, so that it is convenient for users to mount the electronic devices on the server, or to dismount the electronic devices from the server for repairing or replacing. Hence, on the carrier of the server, a handle for allowing a user to grip will be disposed. Moreover, in order to prevent the misuse of the handle by the users, a gripping section of the handle will be fixed onto the carrier by using fastening elements, such as screws. However, using this fixing method, the amount of operating time will be consumed and the cost for manufacturing will be increased, and it lacks convenience for assembling or disassembling the server and the electronic devices.

Therefore, it is necessary to provide a handle which is adapted to a server and allows a user to grip for quickly separating a carrier away from the server. Moreover, when the carrier is inserted into the server and located at a correct point, a gripping section of the handle can be easily fixed on the carrier for preventing misuse by the users.

SUMMARY OF THE INVENTION

In order to solve the above-mentioned technical problems, an objective of the present invention is to provide a handle assembly, by using which it is convenient for users to mount or dismount a variety of electronic devices on electronic equipment (e.g. a server).

Another objective of the present invention is to provide a handle assembly which has a simple structure. A gripping section of the handle assembly can be fixed for preventing misuse by the users.

In order to achieve the above objects, the present invention provides a handle assembly configured for a user's gripping thereon for moving an electronic device from a server, comprising a base seat, a handle, and a button. The handle is assembled on the base seat and has a first surface and a second surface, a height difference exists between the first surface and the second surface. The handle comprises a first pivot connection section located on a terminal of the handle and pivotally connected with the base seat; a gripping section located on another terminal of the handle; a retaining section outwardly extending from the first surface of the handle, and a fastening slot formed between the retaining section and the second surface of the handle. The button has a body section which is assembled on the base seat, and the button allows movement thereof between a first position and a second position in respect to the base seat, and the button comprises a latch which is outwardly extended. When the button is moved to the first position, the latch engages into the fastening slot to restrict a movement of the retaining section, thereby preventing a pivoting movement of the handle relative to the base seat; and when the button is moved to the second position, the latch is separated away from the fastening slot to push the handle, so that the gripping section is pivoted along a direction away from the base seat.

In one preferred embodiment of the present invention, the handle comprises a first inclined plane which is connected between the first surface and the second surface. When the button is moved to the first position, the latch engages into the fastening slot to restrict the movement of the retaining section, thereby preventing the pivoting movement of the handle relative to the base seat; and when the button is moved from the first position to the second position, the latch is separated away from the fastening slot to move along the at least one first inclined plane to push the handle, so that the gripping section is pivoted along the direction away from the base seat.

In one preferred embodiment of the present invention, a second inclined plane is formed on the latch, which corresponds to the first inclined plane of the handle, for guiding the latch when the button is moved from the second position to the first position in which the latch engages into the fastening slot or when the button is moved from the first position to the second position in which the latches separates away from the fastening slot.

In one preferred embodiment of the present invention, the retaining section comprises a horizontal wall and a hook end, the horizontal wall horizontally outwardly extends from the first surface of the handle, and the hook end vertically extends from the horizontal wall and corresponds to the second surface. When the button is moved to the first position from the second position, the latch engages into the fastening slot along the first inclined plane for blocking a movement of the hook end of the retaining section.

In one preferred embodiment of the present invention, the base seat comprises a channel rail and an accommodating space, a notch is formed between the channel rail and the accommodating space, so as to enable the channel rail and the accommodating space to communicate with each other. The accommodating space is used for assembling with the handle, and the channel rail is used for assembling with the body section of the button to allow the button for moving to the first position or the second position. The latch is integrally molded with the body section, and the latch outwardly extends from a lateral side of the body section and extends through the notch into the accommodating space to reach the retaining section of the handle when the button is at the first position.

In one preferred embodiment of the present invention, the button comprises a pushable button connected with the body section, for receiving a push force from the user to control a movement of the button.

In one preferred embodiment of the present invention, handle assembly comprises a positioning elastic piece disposed on the base seat, wherein the positioning elastic piece comprises a first engagement unit, and the button comprises a second engagement unit. When the latch of the button engages in the fastening slot of the handle, the first engagement unit of the positioning elastic piece engages with the second engagement unit of the button, thereby preventing a sliding movement of the latch of the button away from the fastening slot.

In one preferred embodiment of the present invention, when the button is pushed to move from the first position to the second position, the positioning elastic piece is temporarily deflected, thereby enabling the second engagement unit of the button to be separated away from the first engagement unit of the positioning elastic piece.

In one preferred embodiment of the present invention, the first engagement unit and the second engagement unit comprise at least one pair of structurally complementary protrusions and recesses.

In one preferred embodiment of the present invention, the base seat comprises a second pivot connection section, and the handle assembly comprises a return spring and a pivot, the return spring and the pivot are disposed on the second pivot connection section of the base seat and the first pivot connection section of the handle for pivotably connecting the first and second pivot connection sections together, the at least one return spring is used for applying an elastic recovery force on the first pivot connection section of the handle to move the handle toward the base seat and the latch of the button.

In one preferred embodiment of the present invention, the server comprises a chassis and the electronic device is mounted on a carrier, and wherein the base seat of the handle assembly is fixed on the carrier.

DETAILED DESCRIPTION OF THE INVENTION

The structure and the technical means adopted by the present invention to achieve the above and other objects can be best understood by referring to the following detailed description of the preferred embodiments and the accompanying drawings.

Figure 1:
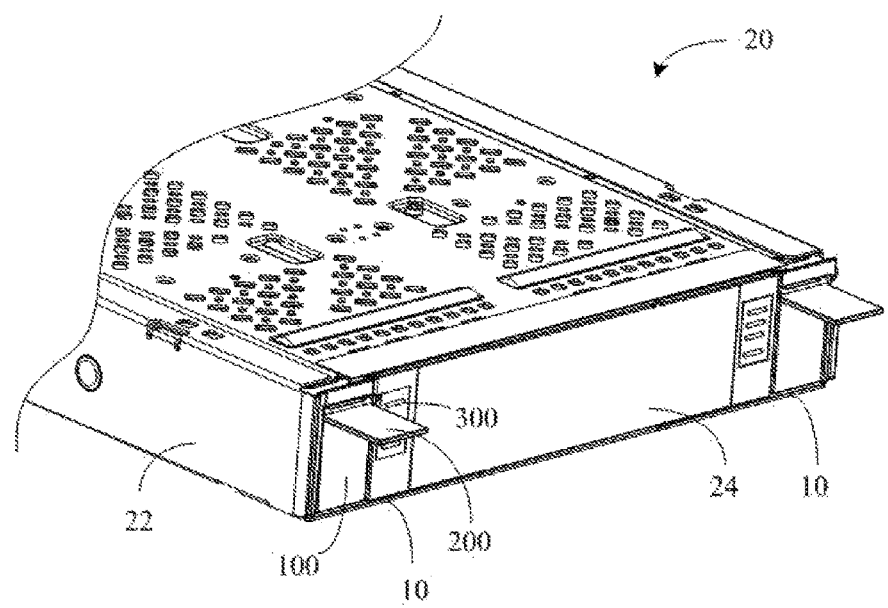
FIG. 1 depicts a schematic diagram of a server having a handle assembly according to a preferred embodiment of the present invention.

Please refer to FIG. 1, which depicts a schematic diagram of a server 20 having a handle assembly 10 according to a preferred embodiment of the present invention. The server 20 comprises a chassis 22 and a carrier 24. The carrier 24 is used for carrying an electronic device (not shown in the drawings), such as a hard disk driver, and the carrier 24 is inserted into the chassis 22 of the server 20 so that the electronic device is electrically connected a corresponding electrical connector (not shown in the drawings).

As shown in FIG. 1, the handle assembly 10 comprises a base seat 100, a handle 200, and a button 300. The base seat 100 is assembled on the carrier 24 of the server 20. Users can easily separate the carrier 24 away from the chassis 22 by gripping the handle 200 of the handle assembly 10 and pulling the carrier 24 away from the chassis 22. It should be noted that the handle assembly 10 of the present invention also can be assembled on a corresponding carrier of another electronic device, for providing the user a grip thereon, but the present invention is not limited thereto. In addition, the number of the handle assembly 10 and the relative location between the server 20 and the handle assembly 10 in FIG. 1 are represented by way of example only, but the present invention is not limited thereto.

Figure 2:
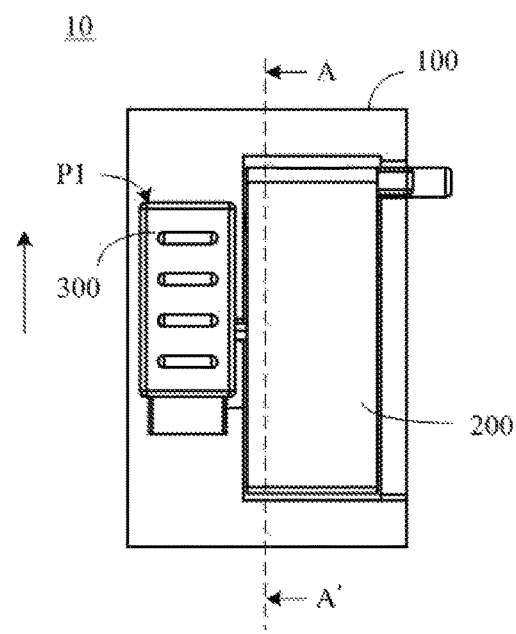
FIG. 2 depicts an operation schematic diagram of the handle assembly according to FIG. 1, where a button of the handle assembly is moved to a first position.
Figure 3:
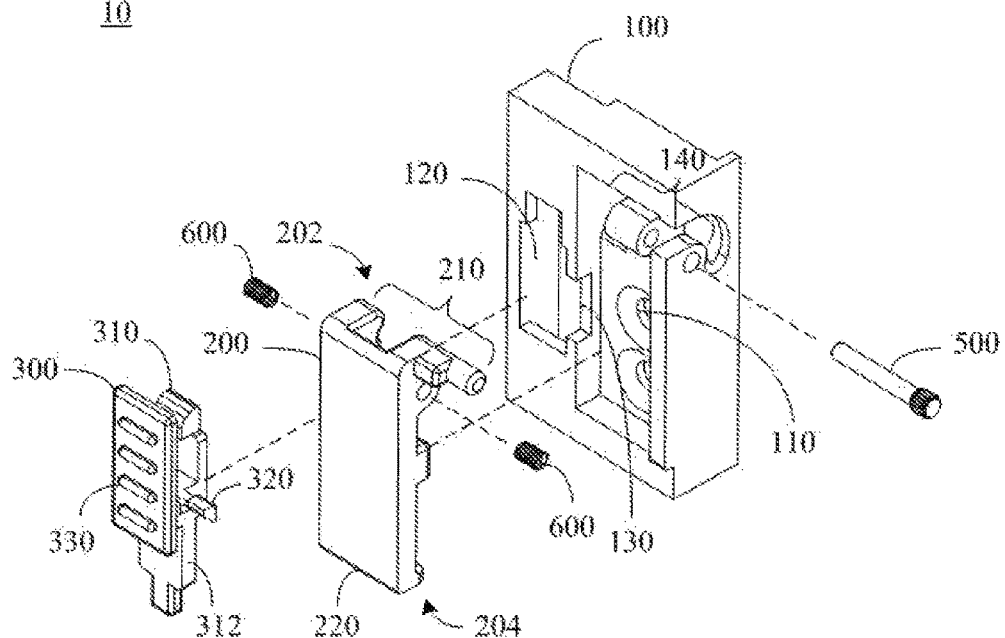
FIG. 3 depicts an exploded diagram of the handle assembly according to FIG. 2.

Please refer to FIG. 2 and FIG. 3. FIG. 2 depicts an operation schematic diagram of the handle assembly 10 according to FIG. 1, where the button 300 of the handle assembly 10 is moved to a first position P1, and FIG. 3 depicts an exploded diagram of the handle assembly 10 according to FIG. 2. A surface of the base seat 100 of the handle assembly 10 is recessed to form an accommodating space 110 and a channel rail 120; a notch 130 is formed between the accommodating space 110 and the channel rail 120, so as to enable the accommodating space 110 and the channel rail 120 to communicate with each other. A second pivot connection section 140 is formed in the accommodating space 110, for assembling with the handle 200, and the button 300 is assembled to the channel rail 120. The handle 200 comprises a first pivot connection section 210 on a first terminal 202 thereof. The first pivot connection section 210 and the second pivot connection section 140 are structurally complementary thereby enabling them to engage with each other. A pivot 500 extends through the first pivot connection section 210 of the handle 200 and the second pivot connection section 140 of the base seat 100, so that the first pivot connection section 210 of the handle 200 and the second pivot connection section 140 of the base seat 100 are pivotally connected for rotation of the handle 200 relative to the base seat 100. The handle 200 also comprises a gripping section 220 on a second terminal 204 thereof, for providing the user a grip thereon. The button 300 comprises a body section 310, a latch 320 which is integrally molded with the body section 310, and outwardly extended from a lateral side 312 of the body section 310, and a pushable button 330 which is connected to a bottom of the body section 310 for receiving the user's pushing force on the button 300 to control a movement of the button 300. The body section 310 of the button 300 is assembled in the channel rail 120 of the base seat 100 to allow the button 300 to move to the first position P1 or a second position P2 (referring to FIG. 6) by pushing the pushable button 330.

Figure 4:
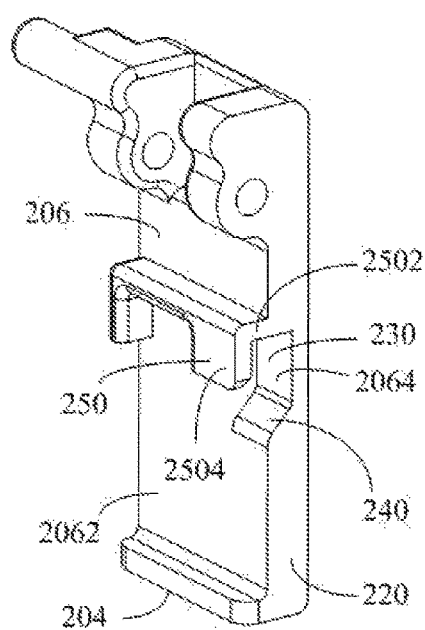
FIG. 4 depicts a perspective view of a handle of the handle assembly according to FIG. 3.
Figure 5:
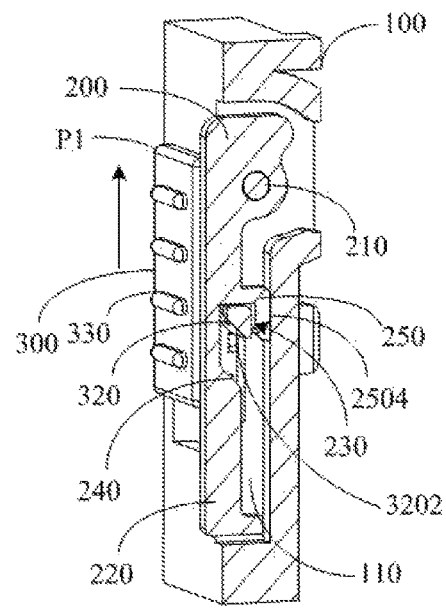
FIG. 5 depicts a cross-sectional view taken along line A-A' of FIG. 2.

Please refer to FIG. 3 to FIG. 5. FIG. 4 depicts a perspective view of the handle 200 of the handle assembly 10 according to FIG. 3, and FIG. 5 depicts a cross-sectional view taken along line A-A' of FIG. 2. As shown in FIG. 3 and FIG. 4, the handle 200 comprises an inner surface 206 facing the accommodating space 110 of the base seat 100. The inner surface 206 comprises a first surface 2062 and a second surface 2064, and there is a height difference existing between the first surface 2062 and the second surface 2064, thereby forming at least one first inclined plane 240 which is connected between the first surface 2062 and the second surface 2064. In the present embodiment, the at least one first inclined plane 240 may comprise a plurality of inclined planes which are connected in series. In other embodiments, the inclined plane 240 may be replaced by a curved surface. As shown in FIG. 3 and FIG. 4, the handle 200 also comprises an L-shaped retaining section 250, which comprises a horizontal wall 2502 and a hook end 2054. The horizontal wall 2502 horizontally rearwards extends from the first surface 2062. The hook end 2054 vertically downwardly extends from a rear end of the horizontal wall 2502 and corresponds to the second surface 2064. A fastening slot 230 is formed between the retaining section 250 (i.e., the horizontal wall 2502 and the hook end 2054) and the second surface 2064. After the handle 200 and the button 300 are respectively assembled in the accommodating space 110 and the channel rail 120 of the base seat 100, the latch 320 of the button 300 extends from the channel rail 120 of the base seat 100 through the notch 130 to reach the accommodating space 110 at a location corresponding the fastening slot 230 or the first inclined plane 240 of the handle 200 (described in detail later). As shown in FIG. 5, there is a second inclined plane 3202 formed on the latch 320 of the button 300 to correspond the first inclined plane 240 of the handle 200.

Please refer to FIG. 4 and FIG. 5, when the button 300 is moved to the first position P1 of the base seat 100 by pushing the pushable button 330, the latch 320 is moved together with the button 300 and the second inclined plane 3202 is moved along the first inclined plane 240, so that the latch 320 is engaged into the fastening slot 230 (see FIG. 5), thereby blocking a movement of the hook end 2054 of the retaining section 250 of the handle 200 away from the base seat 100, and preventing a pivoting movement of the handle 200 about the first pivot connection section 210 away from the base seat 100. In addition, when the button 300 is in the first position P1, the handle 200 is disposed in the accommodating space 110 of the base seat 100 (see FIG. 5), and the gripping section 220 of the handle 200 is accommodated in the accommodating space 110, thereby preventing the use of the handle assembly 10 to move the carrier 24 away from the chassis 22.

Figure 6:
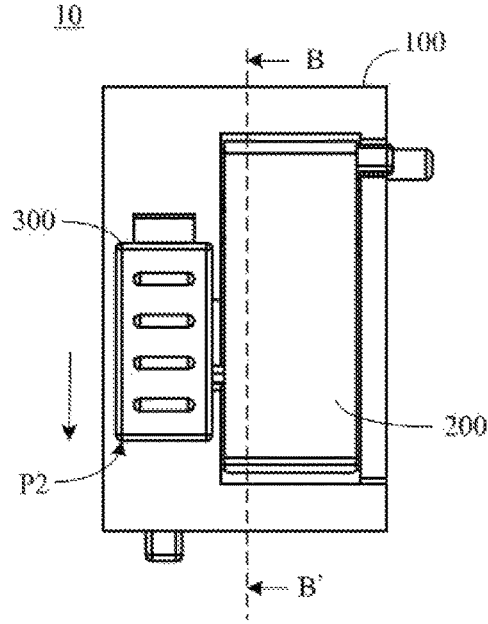
FIG. 6 depicts another operation schematic diagram of the handle assembly according to FIG. 1, where the button of the handle assembly is moved to a second position.
Figure 7:
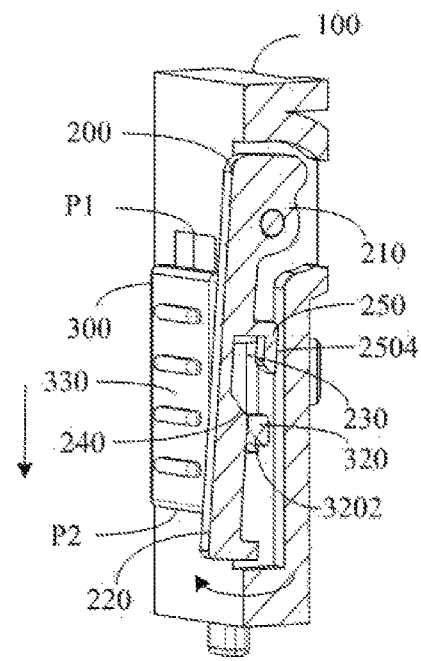
FIG. 7 depicts a cross-sectional view taken along line B-B' of FIG. 6.

Please refer to FIG. 6 and FIG. 7. FIG. 6 depicts another operation schematic diagram of the handle assembly 10 according to FIG. 1, and FIG. 7 depicts a cross-sectional view taken along line B-B' of FIG. 6. When the button 300 of the handle assembly 10 is reversely moved to the second position P2 of the base seat 100 by pushing the pushable button 330, the latch 320 is moved together with the button 300 and the second inclined plane 3202 of the latch 320 is moved along the first inclined plane 240, so that the latch 320 is separated away from the fastening slot 230 to push the handle 200, and the gripping section 220 is pivoted about the first pivot connection section 210 along the direction far away from the base seat 100.

Furthermore, please refer to FIG. 3, the handle assembly 10 also comprises a pair of return springs 600 which are assembled with the pivot 500, the second pivot connection section 140 of the base seat 100, and the first pivot connection section 210 of the handle 200. The return spring 600 can apply an elastic recovery force on the first pivot connection section 210 of the handle 200. To be specific, when the user pulls outwardly on the gripping section 220 of the handle 200, the gripping section 220 will pivot along the direction far away from the base seat 100, and the return spring 600 will deform elastically. When the pulling force is released, the return spring 600 will spring back and the gripping section 220 of the handle 200 will automatically pivot to rest on the latch 320 of the button 300.

Figure 8:
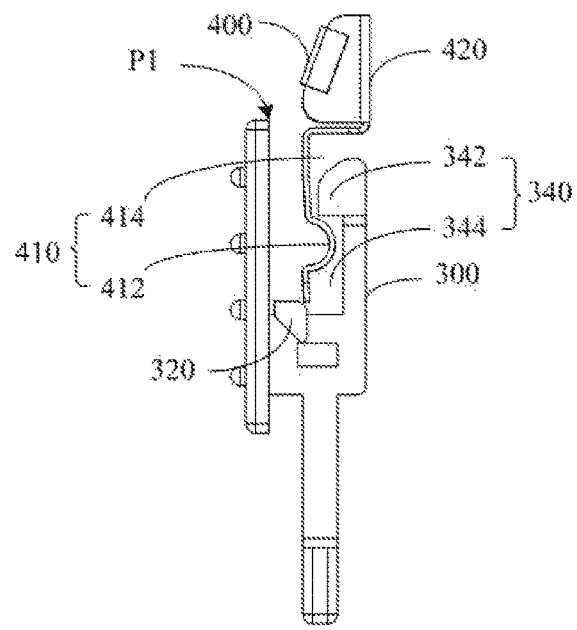
FIG. 8 depicts an operation schematic diagram of the button and a positioning elastic piece according to FIG. 2.
Figure 9:
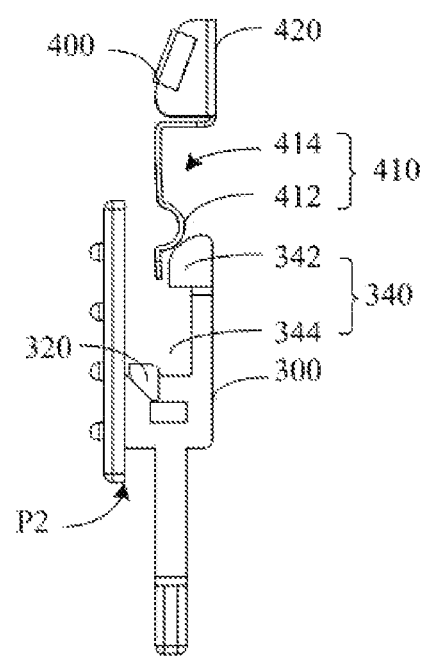
FIG. 9 depicts another operation schematic diagram of the button and the positioning elastic piece according to FIG. 6.

Please refer to FIG. 8 and FIG. 9. FIG. 8 depicts an operation schematic diagram of the button 300 and a positioning elastic piece 400 according to FIG. 2, and FIG. 9 depicts another operation schematic diagram of the button 300 and the positioning elastic piece 400 according to FIG. 6. The handle assembly 10 of the present invention also comprises the positioning elastic piece 400 disposed on the base seat 100, for example, disposed in the channel rail 120 (referring to FIG. 3). The positioning elastic piece 400 comprises a fastening seat 420 and a first engagement unit 410. The button 300 also comprises a second engagement unit 340. Moreover, the first engagement unit 410 of the positioning elastic piece 400 comprises a first protrusion 412 and a first recess 414, and the second engagement unit 340 of the button 300 comprises a second protrusion 342 and a second recess 344. It should be noted that the fastening seat 420 of the positioning elastic piece 400 is fixed on the base seat 100 (not shown in FIG. 8 and FIG. 9).

As shown in FIG. 8, when the button 300 is located at the first position P1 (i.e., the latch 320 of the button 300 engages into the fastening slot 230 of the handle 200, as shown in FIG. 5), the first protrusion 412 of the first engagement unit 410 engages with the second recess 344 of the second engagement unit 340, and the second protrusion 342 of the second engagement unit 340 engages with the first recess 414 of the first engagement unit 410, so that the first engagement unit 410 and the second engagement unit 340 are engaged with each other. Therefore, by engaging the first engagement unit 410 of the positioning elastic piece 400 with the corresponding second engagement unit 340 of the button 300, a sliding movement of the button 300 of the handle assembly 10 along the second position P2 is prevented. That is, the sliding movement of the latch 320 of the button 300 away from the fastening slot 230 of the handle 200 is prevented.

As shown in FIG. 9, when a user pushes the button 300 from the first position PI to the second position P2, the first engagement unit 410 of the positioning elastic piece 400 will be temporarily deflected, thereby enabling the second engagement unit 340 of the button 300 to separate away from the first engagement unit 410 of the positioning elastic piece 400.

In summary, in the handle assembly 10 of the present invention, when the button 300 is moved to the first position P1, the latch 320 will engage into the fastening slot 230 so as to prevent the pivoting movement of the handle 200 relative to the base seat 100. Moreover, if the gripping section 220 of the handle 200 is accommodated and fixed in the accommodating space 110, it can prevent that the carrier 24 from being separated from the chassis 22 by using the handle assembly 10. Furthermore, by pushing the button 300 from the first position P1 to the second position P2, the lock of the handle 200 is released so as to allow the handle 200 to pivot relative to the base seat 100, and the handle 200 will be pushed by the latch 320 of the button 300, so that the gripping section 220 will pivot away from the base seat 100, for providing the user a grip thereon.

The above descriptions are merely preferable embodiments of the present invention, and are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. A handle assembly configured for a user's gripping thereon for moving an electronic device from a server, comprising:
  a base seat;

a handle assembled on the base seat and having a first surface and a second surface, a height difference existing between the first surface and the second surface, the handle comprising:
  a first pivot connection section located on a terminal of the handle and pivotally connected with the base seat;
  a gripping section located on another terminal of the handle;
  a retaining section outwardly extending from the first surface of the handle, and a fastening slot formed between the retaining section and the second surface of the handle; and
  a button having a body section which is assembled on the base seat, and the button allowing movement thereof between a first position and a second position in respect to the base seat, and the button comprising a latch which is outwardly extended,
wherein when the button is moved to the first position, the latch engages into the fastening slot to restrict a movement of the retaining section, thereby preventing a pivoting movement of the handle relative to the base seat;
when the button is moved to the second position, the latch is separated away from the fastening slot to push the handle, so that the gripping section is pivoted along a direction away from the base seat;
wherein the base seat comprises a second pivot connection section, and the handle assembly comprises at least one return spring, a pivot, and at least one first inclined plane which is connected between the first surface and the second surface, the at least one return spring and the pivot are disposed on the second pivot connection section of the base seat and the first pivot connection section of the handle for pivotably connecting the first and second pivot connection sections together; and
wherein the at least one return spring is used for applying an elastic recovery force on the first pivot connection section of the handle to move the handle toward the base seat to rest on the latch of the button, such that when the button is moved to the first position along the at least one first inclined plane, the latch engages into the fastening slot to restrict the movement of the retaining section, thereby preventing the pivoting movement of the handle relative to the base seat.

2. The handle assembly as claimed in claim 1, wherein when the button is moved to from the first position to the second position, the latch is separated away from the fastening slot to move along the at least one first inclined plane to push the handle, so that the gripping section is pivoted along the direction away from the base seat.

3. The handle assembly as claimed in claim 1, wherein a second inclined plane is formed on the latch, which corresponds to the at least one first inclined plane of the handle, for guiding the latch when the button is moved from the second position to the first position in which the latch engages into the fastening slot or when the button is moved from the first position to the second position in which the latches separates away from the fastening slot.

4. The handle assembly as claimed in claim 2, wherein the retaining section comprises a horizontal wall and a hook end, the horizontal wall horizontally outwardly extends from the first surface of the handle, and the hook end vertically extends from the horizontal wall and corresponds to the second surface; when the button is moved to the first position from the second position, the latch engages into the fastening slot along the at least one first inclined plane for blocking a movement of the hook end of the retaining section.

5. The handle assembly as claimed in claim 1, wherein the base seat comprises a channel rail and an accommodating space, a notch is formed between the channel rail and the accommodating space, so as to enable the channel rail and the accommodating space to communicate with each other;
  the accommodating space is used for assembling with the handle, and the channel rail is used for assembling with the body section of the button to allow the button for moving to the first position or the second position; and
  the latch is integrally molded with the body section, and the latch outwardly extends from a lateral side of the body section and extends through the notch into the accommodating space to reach the retaining section of the handle when the button is at the first position.

6. The handle assembly as claimed in claim 1, further comprising a positioning elastic piece disposed on the base seat, wherein the positioning elastic piece comprises a first engagement unit, and the button comprises a second engagement unit, when the latch of the button engages in the fastening slot of the handle, the first engagement unit of the positioning elastic piece engages with the second engagement unit of the button, thereby preventing a sliding movement of the latch of the button away from the fastening slot.

7. The handle assembly as claimed in claim 6, wherein when the button is pushed to move from the first position to the second position, the positioning elastic piece is temporarily deflected, thereby enabling the second engagement unit of the button to be separated away from the first engagement unit of the positioning elastic piece.

8. The handle assembly as claimed in claim 6, wherein the first engagement unit and the second engagement unit comprise at least one pair of structurally complementary protrusions and recesses.

9. The handle assembly as claimed in claim 1, wherein the button comprises a pushable button connected with the body section, for receiving a push force from the user to control a movement of the button.

10. The handle assembly as claimed in claim 1, wherein the server comprises a chassis and the electronic device is mounted on a carrier, and wherein the base seat of the handle assembly is fixed on the carrier.

11. A handle assembly configured for a user's gripping thereon for moving an electronic device from a server, comprising:
  a base seat;
  a handle assembled on the base seat and having a first surface and a second surface, a height difference existing between the first surface and the second surface, the handle comprising:
    a first pivot connection section located on a terminal of the handle and pivotally connected with the base seat;
    a gripping section located on another terminal of the handle;
    a retaining section outwardly extending from the first surface of the handle, and a fastening slot formed between the retaining section and the second surface of the handle; and
    a button having a body section which is assembled on the base seat, and the button allowing linear movement thereof between a first position and a second position in respect to the base seat, and the button comprising a latch which is outwardly extended and linearly movable with the button, wherein when the button is moved to the first position, the latch engages into the fastening slot to restrict a movement of the retaining section, thereby preventing a pivoting movement of the handle relative to the base seat;

when the button is moved to the second position, the latch is separated away from the fastening slot to push the handle, so that the gripping section is pivoted along a direction away from the base seat;

wherein the base seat comprises a second pivot connection section, and the handle assembly comprises at least one return spring, a pivot, and at least one first inclined plane which is connected between the first surface and the second surface, the at least one return spring and the pivot are disposed on the second pivot connection section of the base seat and the first pivot connection section of the handle for pivotably connecting the first and second pivot connection sections together; and wherein the at least one return spring is used for applying an elastic recovery force on the first pivot connection section of the handle to move the handle toward the base seat to rest on the latch of the button, such that when the button is moved to the first position along the at least one first inclined plane, the latch engages into the fastening slot to restrict the movement of the retaining section, thereby preventing the pivoting movement of the handle relative to the base seat.

\* \* \* \* \*